(12) United States Patent
Kolobov et al.

(10) Patent No.: US 12,310,125 B2
(45) Date of Patent: May 20, 2025

(54) AVALANCHE PHOTODETECTOR (VARIANTS) AND METHOD FOR MANUFACTURING THE SAME (VARIANTS)

(71) Applicant: DEPHAN LLC, Moscow (RU)

(72) Inventors: Nikolai Afanasevich Kolobov, Moscow (RU); Konstantin Yurevich Sitarskiy, Moscow (RU); Vitalii Emmanuilovich Shubin, Moscow (RU); Dmitrii Alekseevich Shushakov, Moscow (RU); Sergei Vitalevich Bogdanov, Moscow (RU)

(73) Assignee: Dephan LLC, Moscow (RU)

( * ) Notice: Subject to any disclaimer, the term of this patent is extended or adjusted under 35 U.S.C. 154(b) by 895 days.

(21) Appl. No.: 17/432,913

(22) PCT Filed: Mar. 4, 2020

(86) PCT No.: PCT/RU2020/050038
§ 371 (c)(1),
(2) Date: Aug. 21, 2021

(87) PCT Pub. No.: WO2020/185125
PCT Pub. Date: Sep. 17, 2020

(65) Prior Publication Data
US 2022/0190183 A1   Jun. 16, 2022

(30) Foreign Application Priority Data

Mar. 12, 2019   (RU) .......................... RU2019106925

(51) Int. Cl.
*H10F 30/225*   (2025.01)
*H10F 39/10*   (2025.01)
(Continued)

(52) U.S. Cl.
CPC ....... *H10F 30/225* (2025.01); *H10F 71/1221* (2025.01); *H10F 71/1385* (2025.01)

(58) Field of Classification Search
CPC . H01L 31/107; H01L 31/182; H01L 31/1888; H01L 27/1443; H01L 31/022466;
(Continued)

(56) References Cited

U.S. PATENT DOCUMENTS 7,829,915 B2   11/2010   Shi et al.
9,035,410 B2   5/2015   Yuan et al.
(Continued)

FOREIGN PATENT DOCUMENTS

RU           2641620 C1 *   1/2018   ....... H01L 31/02161

OTHER PUBLICATIONS

RU_2641620_C1_English (Year: 2018).*
RU 2641620 C1 Machine Translation (Year: 2018).*
Search Report in PCT/RU2020/050038 dated Sep. 1, 2020.

*Primary Examiner* — Yara B Green
*Assistant Examiner* — Akhee Sarker-Nag
(74) *Attorney, Agent, or Firm* — Bardmesser Law Group (57) ABSTRACT

Method for manufacturing avalanche photodetector, including forming multiplication layer on wafer; etching closed groove on surface of the multiplication layer, so that depth of the closed groove is greater than or equal to thickness of the multiplication layer, but less than total thickness of the wafer and multiplication layer combined; filling the groove with highly-doped polycrystalline silicon of same conductivity type as multiplication layer; forming, on upper surface of multiplication layer, inside groove, avalanche amplifier as mesa structure, by forming contact layer on multiplication layer, while simultaneously forming photoconverter outside contact layer, and etching away portion of multiplication layer in the photoconverter to depth less than thickness of
(Continued)

the multiplication layer; forming dielectric layer on multiplication layer where etching took place, its thickness equal to the depth of multiplication layer that was etched away; forming first electrode of transparent material on surfaces of contact and dielectric layers; forming second electrode.

14 Claims, 6 Drawing Sheets

(51) Int. Cl.
*H10F 71/00* (2025.01)
*H10F 77/122* (2025.01)
*H10F 77/14* (2025.01)
*H10F 77/20* (2025.01)

(58) Field of Classification Search
CPC ........... H01L 31/035281; H01L 31/028; H01L 31/1804; H10F 71/1221; H10F 71/1385; H10F 30/225

See application file for complete search history.

(56) References Cited

U.S. PATENT DOCUMENTS

| | | | |
|---|---|---|---|
| 9,570,647 B2 | 2/2017 | Yuan et al. | |
| 10,340,407 B2 | 7/2019 | Shubin et al. | |
| 2006/0249747 A1* | 11/2006 | Shushakov | H10F 39/103 |
| | | | 257/E27.128 |
| 2011/0024768 A1* | 2/2011 | Veliadis | H10F 30/225 |
| | | | 257/77 |
| 2013/0009265 A1* | 1/2013 | Dautet | H10F 30/225 |
| | | | 257/E31.124 |
| 2017/0098730 A1* | 4/2017 | Mazzillo | H10F 71/00 |
| 2018/0351023 A1* | 12/2018 | Shubin | H10F 71/121 |

* cited by examiner

AVALANCHE PHOTODETECTOR (VARIANTS) AND METHOD FOR MANUFACTURING THE SAME (VARIANTS)

CROSS REFERENCE TO RELATED APPLICATIONS

This application is a US National Phase of PCT/RU2020/050038, filed on Mar. 4, 2020, which claims priority to Russian Patent Application No. 2019106925, filed on Mar. 12, 2019.

FIELD OF INVENTION

The present invention relates to avalanche photodetectors (APD) that are capable of detecting weak light signals. Such APDs are widely used in LiDARs, communications systems, machine vision, robotics, medicine, biology, environmental monitoring, etc.

DESCRIPTION OF THE RELATED ART

A conventional avalanche photodetector (APD) comprises a number of semiconductor material layers put, one after another, onto a semiconductor wafer.

A group of semiconductor layers forms a photoconverter, in which signal photons are absorbed generating free charge carriers, i.e., electrons or electron holes. These light-generated charge carriers then get into another group of semiconductor layers, i.e., an avalanche amplifier, inside which an area is formed where the intensity of electric field is sufficiently high for avalanche multiplication of charge carriers.

Threshold sensitivity is a major parameter of an APD and depends on the properties of both the photoconverter and the avalanche amplifier.

Threshold sensitivity is largely limited by the dark current of the avalanche amplifier, which is mainly caused by the highly intense field that is required for avalanche multiplication of photocarriers.

In order to reduce the dark current of the avalanche amplifier and, therefore, increase the APD's threshold sensitivity, the area occupied by the avalanche amplifier can be made smaller in relation to the area occupied by the photoconverter.

Examples of this can be seen, e.g., in avalanche photodetectors according to U.S. Pat. No. 9,035,410 and RU 2,641,620 that disclose a construction where an avalanche amplifier comprising two layers—a contact layer and a multiplication layer—and a photoconverter are both located on the same wafer near one another, and the area of the photoconverter is greater than that of the amplifier.

In the APD according to the patent RU 2,641,620, the multiplication layer is made of a semiconductor material with the same conductivity type as the signal photoconverter, faces the semiconductor wafer and directly adjoins the autonomous photoconverter, which allows one to reduce excessive dark noises caused by photocarriers being transmitted from the photoconverter to the avalanche amplifier over an external electrical circuit (see U.S. Pat. No. 9,035,410).

DRAWBACKS OF PRIOR ART

The main drawback is that making the multiplication layer independent of the photoconverter hinders photocarriers generated in the photoconverter layer from getting to the multiplication layer, thus causing multiplied photosignal losses. This results in deteriorated threshold sensitivity, which is a basic parameter of a photodetector.

Technical Problem

The objective of the present disclosure is to create an avalanche photodetector (APD) having a high threshold sensitivity, which will not be limited by inefficient transmission of photocarriers from the photoconverter to the avalanche amplifier. In addition, one of the proposed APD embodiments will have less dark current from neighboring regions. Finally, the APD design claimed provides less interference noise from adjacent avalanche amplifiers in case a plurality of such amplifiers are used in the same APD.

By solving all these problems, it will be possible to improve the APD's threshold sensitivity, its basic parameter.

SUMMARY OF THE INVENTION

The claimed invention comprises an avalanche photodetector (APD) and a method for manufacturing the same, which allows one to make the transmission of photocarriers from the photoconverter to the avalanche amplifier more efficient by putting the multiplication layer all over the conductive wafer. The contact layer of at least one avalanche amplifier is formed in a certain area of the multiplication layer. Thus, the multiplication layer outside the contact layer functions as a photoconverter. As a result, the photocarriers that have been initiated in the photoconverter will get into the multiplication region of the avalanche amplifier unimpeded. The first electrode and the second electrode of the avalanche photodetector are placed on the contact layer and the wafer, respectively.

In order to reduce the APD's dark current from adjacent wafer regions, a closed groove is etched on the multiplication layer surface, its depth is more than or equal to the multiplication layer thickness, but less than the total thickness of the wafer and multiplication layer combined, and a photodetector is formed inside the region bounded by said groove. The groove is filled with highly doped polycrystalline silicon of the same conductivity type as the multiplication layer.

In order to suppress the interference noise from adjacent avalanche amplifiers (the noise arising when parasite photoelectrons of photons from hot charge carriers in adjacent avalanche amplifiers get into the multiplication region), the regions of the avalanche amplifiers are positioned higher than the photocarrier generation region.

To achieve this, some of the multiplication layer in the photoconverter region is etched away, the amount etched being less than the layer thickness. Then, a dielectric layer is put onto the etched away surface of the multiplication layer, the dielectric layer thickness being equal to the etched-away amount of the multiplication layer in the photoconverter region, and the first electrode, which is made of a transparent material, is put onto the surfaces of both the avalanche amplifier's contact layer and dielectric layer.

For increased efficiency, the semiconductor wafer should be made of low-resistance materials.

Preferably both the wafer and multiplication layer are made of the same semiconductor material.

The multiplication layer on the wafer surface can be made using the epitaxy method, and the contact layer can be made by doping the multiplication layer with a dopant that forms a layer with the opposite conductivity.

Preferably the closed groove has a width of 1.5 µm to 2.0 µm.

It is also possible to put a high-resistance layer between the contact layer of the avalanche amplifier and the first electrode.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 is a schematic transversal section of the claimed APD according to the second embodiment that comprises a semiconductor wafer 201, a multiplication layer 202 covering the entire surface of the semiconductor wafer, a contact layer 205 covering a certain area of the multiplication layer 202, wherein at least one avalanche amplifier 203 region and a photoconverter 204 region, which is outside the avalanche amplifier, are formed, a closed groove 208 with the width of 1.5 µm to 2.0 µm and the depth, which is more than or equal to the multiplication layer thickness, but less than the total thickness of the wafer and multiplication layer combined, and which is filled with highly doped polycrystalline silicon of the same conductivity type as the multiplication layer and encircles avalanche amplifiers and the photoconverter, a first electrode 206, which is formed on the contact layer, and a second electrode 207, which is formed on the semiconductor wafer. The groove 208 can have a rectangular profile, like it's shown in the drawings, however, its profile largely depends on the deep etching method that is used to etch the groove in silicon.

FIG. 3 is a schematic transversal section of the claimed APD according to the third embodiment that comprises a semiconductor wafer 301, a multiplication layer 302 covering the entire surface of the semiconductor wafer, a contact layer 305 covering a certain area of the multiplication layer 302, wherein at least one avalanche amplifier 303 region and a photoconverter 304 region, which is outside the avalanche amplifier, are formed, a closed groove 308 with the width of 1.5 µm to 2.0 µm and the depth, which is more than or equal to the multiplication layer thickness, but less than the total thickness of the wafer and multiplication layer combined, and which is filled with highly doped polycrystalline silicon of the same conductivity type as the multiplication layer and encircles avalanche amplifiers and the photoconverter, a dielectric layer 309 partly filling the photoconverter 304 region that has been etched away by an amount that is less than the multiplication layer thickness, a high-resistance layer 310, which is formed on the contact layer 305 within the avalanche amplifier region, a transparent electrode 311, which is formed on the high-resistance layer 310 and dielectric layer 309 surfaces, and a second electrode 307, which is formed on the semiconductor wafer. The photoconverter 304 region can be etched away, e.g., by about 1.5-2.5 µm.

DETAILED DESCRIPTION OF PREFERRED EMBODIMENTS

Reference will now be made in detail to the preferred embodiments of the present invention, examples of which are illustrated in the accompanying drawings.

The reference markings used across the present disclosure and accompanying drawings, except number 100 (incident light), consist of three digits, wherein the first digit is the figure number and the last two digits mark a specific element of the design.

For example, marking 306 points at the element number 06 (see the list below) in FIG. 3.

The following markings are used to point at specific elements of the design:
- 01—wafer,
- 02—multiplication layer,
- 03—avalanche amplifier,
- 04—photoconverter,
- 05—contact layer,
- 06—first electrode,
- 07—second electrode,
- 08—closed groove,
- 09—dielectric layer,
- 10—high-resistance material layer,
- 11—transparent electrode.

Figure 1:
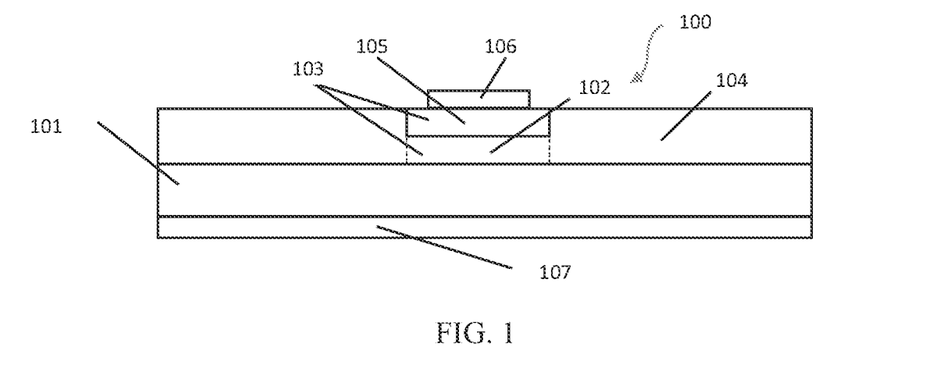
FIG. 1 is a schematic transversal section of the claimed APD according to the first embodiment that comprises a semiconductor wafer 101, a multiplication layer 102 covering the entire surface of the semiconductor wafer, a contact layer 105 covering a certain area of the multiplication layer, wherein at least one avalanche amplifier 103 and photoconverter 104, which is outside the avalanche amplifier, are formed, a first electrode 106 that is formed on the contact layer 105, and a second electrode 107 that is formed on the semiconductor wafer 101.

FIG. 1 shows a schematic transversal section of the claimed APD according to the first embodiment that comprises a semiconductor wafer 101, a multiplication layer 102 covering the entire surface of the semiconductor wafer, a contact layer 105 covering a certain area of the multiplication layer, wherein at least one avalanche amplifier 103 region and photoconverter 104, which is outside the avalanche amplifier, are formed, a first electrode 106 that is formed on the contact layer, and a second electrode 107 that is formed on the semiconductor wafer 101.

Figure 1A:
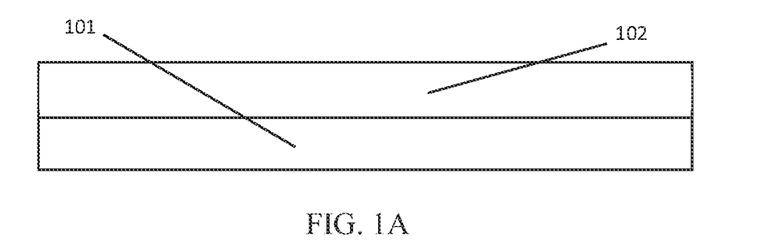
FIG. 1A shows the process of putting the multiplication layer 102 onto the silicon wafer 101.

The method for manufacturing the APD as shown in FIG. 1 is further illustrated by FIGS. 1A, 1B, 1C, 1D and comprises the following sequence of steps:

Putting, onto the silicon wafer 101, a multiplication layer 102 of the same conductivity type as the wafer (see FIG. 1A).

Figure 1B:
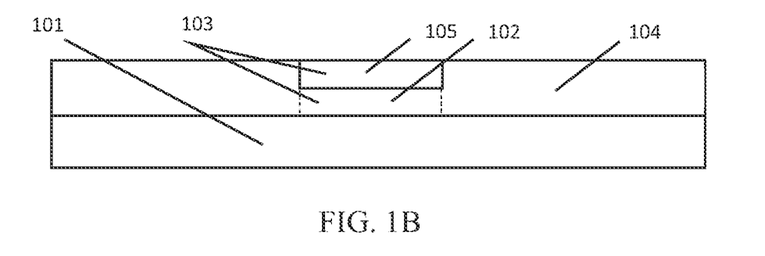
FIG. 1B shows the process of forming the avalanche amplifier 103 regions by creating a contact layer 105.

Forming, on top of the multiplication layer, one or several avalanche amplifier 103 regions by doping the multiplication layer 102 with a dopant of the opposite conductivity type (see FIG. 1B).

Figure 1C:
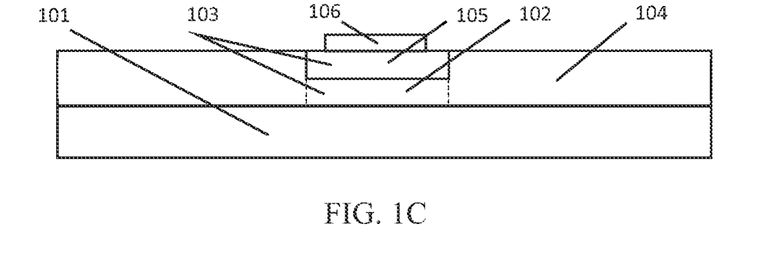
FIG. 1C shows the process of forming the first electrode 106 on the contact layer 105.

Forming, on the contact layer, a first electrode 106 (see FIG. 1C).

Figure 1D:
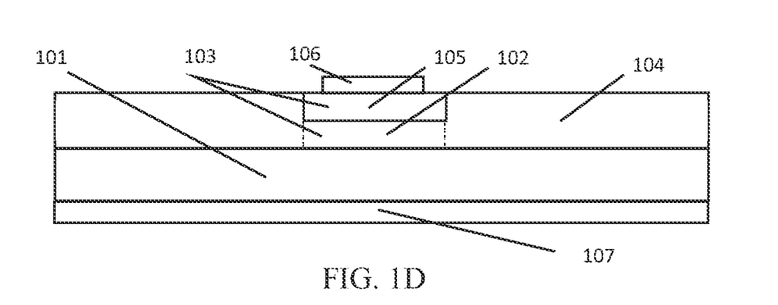
FIG. 1D shows the process of forming the second electrode 107 on the semiconductor wafer 101.

Forming, on the semiconductor wafer 101, a second electrode 107 (see FIG. 1D).

An exemplary APD according to FIG. 1 can be manufactured using the method that involves formation, by epitaxy, of the multiplication layer 102, which has width of 5-7 μm and is made of p-type silicon with dopant concentration of $10^{15}$-$10^{17}$ cm$^{-3}$, on the silicon wafer 101 of the p+-type with dopant concentration higher than $10^{18}$ cm$^{-3}$. The avalanche amplifier 103 is made by putting the contact layer 105, formed through diffusion of the n-type dopant with concentration of more than $10^{18}$ cm$^{-3}$ to the depth of 0.5-1.0 μm, onto the multiplication layer 102. The first electrode 106 is formed on top of the contact layer 105, and the second electrode 107 is formed on the bottom surface of the wafer 101. Both electrodes are made of aluminum foil with thickness of approximately 0.5-1.0 μm.

The APD as shown in FIG. 1 functions as follows:

Positive voltage is applied to the electrode 106 relative to the electrode 107, enough to trigger impact ionization in the multiplication layer 102 of the avalanche amplifier 103 causing free charge carriers to multiply.

Signal light 100 falling upon the surface of the photoconverter 104 region is absorbed, generating free charge carriers, i.e., electrons and electron holes. Free electrons that have been induced by light in the photoconverter 104 region are captured by the field seeping from the avalanche amplifier 103 and then drift towards the avalanche multiplication region 102 to be multiplied there, generating the APD's output signal, while the holes make their way into the wafer 101. Photoelectrons that have been induced by light in the non-depleted area of the photoconverter 104, are gathered in the depletion area of the photoconverter by means of diffusion caused by free electron concentration gradient in the photoconverter. The process of drift-diffusion collecting of photocarriers in the avalanche amplifier is highly efficient, because the amplifier's multiplication region and photoconverter region are both parts of the same multiplication layer that covers the wafer.

In order to improve the APD's performance, the photoconverter width is mainly less than 10 μm to reduce the share of diffusely collected photocarriers.

Figure 2:
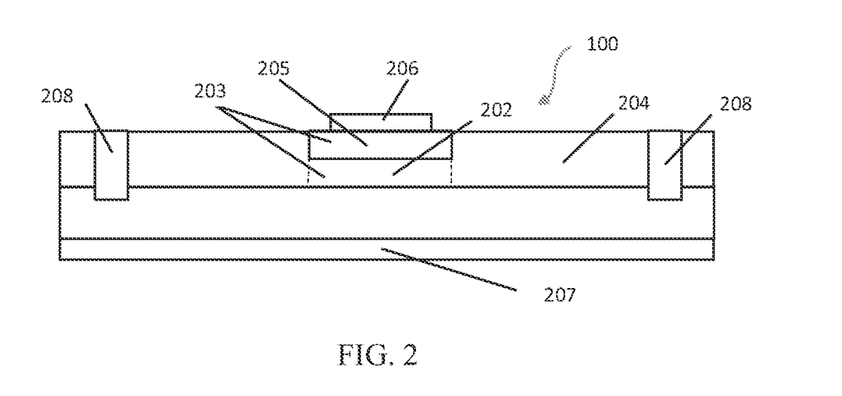
FIG. 2A shows the process of putting the multiplication layer 202 onto the silicon wafer 201.
FIG. 2B shows the process of forming a closed groove 208, which is filled with highly doped polycrystalline silicon of the same conductivity type as the multiplication layer, so that the photodetector can be formed inside the region bounded by said groove.
FIG. 2C shows the process of forming the avalanche amplifier 203 regions by creating a contact layer 205.
FIG. 2D shows the process of forming the first electrode 206 on the contact layer 205.
FIG. 2E shows the process of forming the second electrode 207 on the semiconductor wafer 201.

FIG. 2 shows a schematic transversal section of the claimed APD according to the second embodiment that comprises a semiconductor wafer 201, a multiplication layer 202 covering the entire surface of the semiconductor wafer, a contact layer 205 covering a certain area of the multiplication layer 202, wherein at least one avalanche amplifier 203 region and a photoconverter 204 region, which is outside the avalanche amplifier, are formed, a closed groove 208 with the width of 1.5 μm to 2.0 μm and the depth, which is more than or equal to the multiplication layer thickness, but less than the total thickness of the wafer and multiplication layer combined, and which is filled with highly doped polycrystalline silicon of the same conductivity type as the multiplication layer and encircles avalanche amplifiers and the photoconverter, a first electrode 206, which is formed on the contact layer, and a second electrode 207, which is formed on the semiconductor wafer. The closed groove 208 can have a rectangular profile, like it's shown in the drawings, however, its profile largely depends on the deep etching method that is used to etch the groove in silicon.

Figure 2A:
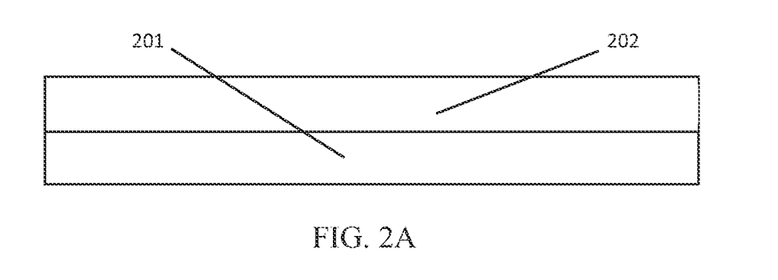
Figure 2B:
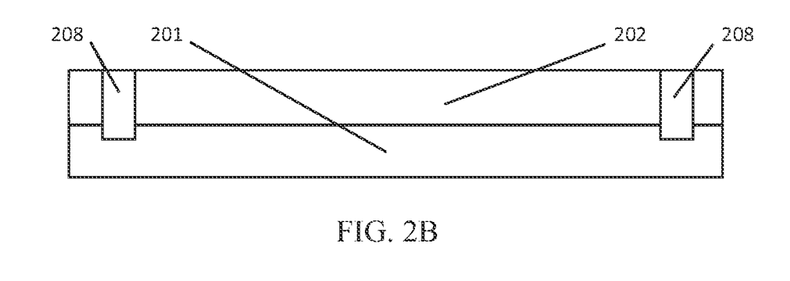

The method for manufacturing the APD as shown in FIG. 2 is further illustrated by FIGS. 2A, 2B, 2C, 2D, 2E and comprises the following sequence of steps:

Putting, onto the silicon wafer 201, a multiplication layer 202 of the same conductivity type as the wafer (see FIG. 2A).

Etching, on the multiplication layer 202 surface, a closed groove 208 with the depth, which is more than or equal to the multiplication layer thickness, but less than the total thickness of the wafer and multiplication layer combined, and filling it with highly doped polycrystalline silicon of the same conductivity type as the multiplication layer 202 (see FIG. 2B), so that a photodetector can be formed inside the region bounded by the groove.

Figure 2C:
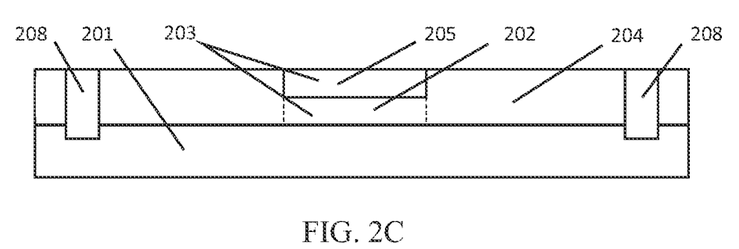

Forming, on top of the multiplication layer 202 and within the region bounded by the closed groove 208, one or several avalanche amplifier 203 regions by creating a contact layer 205 though doping of the multiplication layer 202 with the dopant of the opposite conductivity type and thus forming a photoconverter 204 region outside the avalanche amplifier 203 (see FIG. 2C).

Figure 2D:
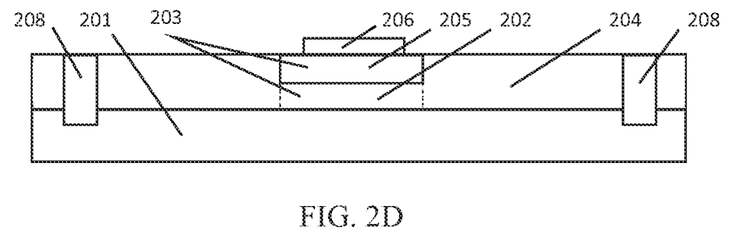

Forming, on the contact layer, a first electrode 206 (see FIG. 2D).

Figure 2E:
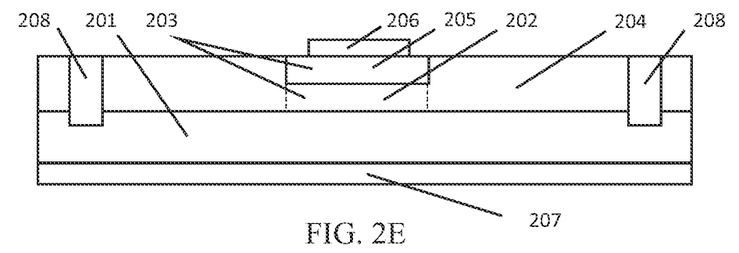

Forming, on the semiconductor wafer 201, a second electrode 207 (see FIG. 2E).

An exemplary APD according to FIG. 2 can be manufactured using the method that involves formation, by epitaxy, of the multiplication layer 202, which has width of 5-7 μm and is made of p-type silicon with dopant concentration of $10^{15}$-$10^{17}$ cm$^{-3}$, on the silicon wafer 201 of the p+-type with dopant concentration higher than $10^{18}$ cm$^{-3}$. Then, a closed groove 208 with the width of 1.5 μm to 2.0 μm and the depth, which more than or equal to the multiplication layer thickness, but less than the total thickness of the wafer and multiplication layer combined, is etched on the multiplication layer 202 surface and filled with highly doped polycrystalline silicon of the same conductivity type as the multiplication layer 202, so that a photodetector can be formed inside the region bounded by said groove.

The avalanche amplifier 203 is made by putting the contact layer 205, formed through diffusion of the n-type dopant with concentration of more than $10^{18}$ cm$^{-3}$ to the depth of 0.5-1.0 μm, onto the multiplication layer 202. The first electrode 206 is formed on top of the contact layer 205, and the second electrode 207 is formed on the bottom surface of the wafer 201. Both electrodes are made of aluminum foil with thickness of 0.5-1.0 μm.

The APD as shown in FIG. 2, i.e., having a closed groove that runs along the multiplication layer edges, is characterized in that it allows to suppress the inflow of parasite charge carriers—both dark and light—which get into the avalanche amplifier from neighboring regions. In order to effectively suppress such parasite currents, the groove, whose depth is more than the multiplication layer thickness, is to be filled with highly doped polycrystalline silicon of the same conductivity type as the multiplication layer. Less dark current in the APD results in additional improvement of threshold sensitivity.

Otherwise, this APD embodiment functions in the same way as that illustrated by FIG. 1.

Figure 3:
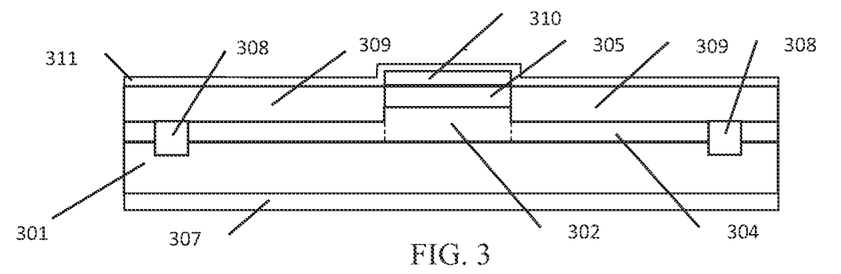
FIG. 3A shows the process of putting the multiplication layer 302 onto the silicon wafer 301.
FIG. 3B shows the process of forming a closed groove 308, which is filled with highly doped polycrystalline silicon of the same conductivity type as the multiplication layer, so that the photodetector can be formed inside the region bounded by said groove.
FIG. 3C shows the process of forming one or several avalanche amplifier 303 regions by creating a contact layer 305 though doping of the multiplication layer 302 with the dopant of the opposite conductivity type and thus forming a photoconverter 304 region outside the avalanche amplifier 303.
FIG. 3D shows the process of etching away some area of the photoconverter 304 outside the avalanche amplifier 303, by an amount that is less than the multiplication layer 302 thickness.
FIG. 3E shows the process of filling the etched-away area of the photoconverter 304 with the dielectric layer 309.
FIG. 3F shows the process of forming a high-resistance layer 310 on the contact layer 305 within the avalanche amplifier 303 region.
FIG. 3G shows the process of forming the transparent electrode 311 on the surfaces of the high-resistance layer 310 and dielectric layer 309.
FIG. 3H shows the process of forming the second electrode 307 on the semiconductor wafer 301.

FIG. 3 shows a schematic transversal section of the claimed APD according to the third embodiment that comprises a semiconductor wafer 301, a multiplication layer 302 covering the entire surface of the semiconductor wafer, a contact layer 305 covering a certain area of the multiplication layer 302, with at least one avalanche amplifier 303 forming a mesa structure (see FIG. 3C) and a photoconverter region 304, which is outside the avalanche amplifier, are formed. A mesa type structure means that the device is positioned above the substrate, i.e., the substrate is etched back to leave the device isolated from surrounding material. Etching to leave the device isolated enables the device to have a faster operating speed.

A closed groove 308 with the width of 1.5 μm to 2.0 μm and the depth, which is more than or equal to the multiplication layer thickness, but less than the total thickness of the wafer and multiplication layer combined, and which is filled with highly doped polycrystalline silicon of the same conductivity type as the multiplication layer and encircles avalanche amplifiers and the photoconverter, a dielectric layer 309 partly filling the photoconverter 304 region that has been etched away by an amount that is less than the multiplication layer thickness, a high-resistance layer 310, which is formed on the contact layer 305 within the avalanche amplifier region, a transparent electrode 311, which is formed on the high-resistance layer 310 and dielectric layer 309 surfaces, and a second electrode 307, which is formed on the semiconductor wafer. Like in the above embodiment, the groove 308 can have a rectangular profile, like it's shown in the drawings, however, its profile largely depends on the deep etching method that is used to etch the groove in silicon.

Figure 3A:
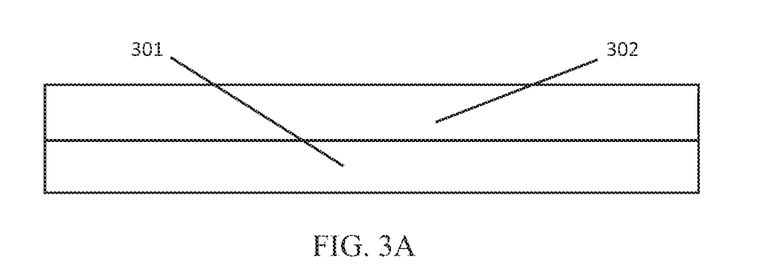
Figure 3B:
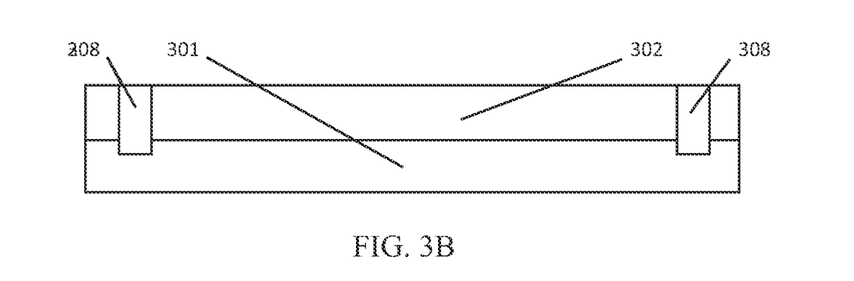

The method for manufacturing the APD as shown in FIG. 3 is further illustrated by FIGS. 3A, 3B, 3C, 3D, 3E, 3F, 3G, 3H and comprises the following sequence of steps:

Putting, onto the silicon wafer 301, a multiplication layer 302 of the same conductivity type as the wafer (see FIG. 3A).

Etching, on the multiplication layer 302 surface, a closed groove 308 with the depth, which is more than or equal to the multiplication layer thickness, but less than the total thickness of the wafer and multiplication layer combined, and filling it with highly doped polycrystalline silicon of the same conductivity type as the multiplication layer 302 (see FIG. 3B), so that a photodetector can be formed inside the region bounded by said groove.

Figure 3C:
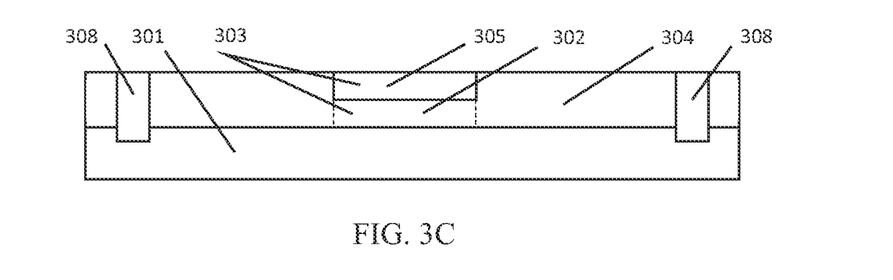

Forming, on the multiplication layer 302 top surface, one or several avalanche amplifier 303 regions, by creating a contact layer 305 though doping of the multiplication layer 302 with the dopant of the opposite conductivity type and thus forming a photoconverter 304 region outside the avalanche amplifier 303 (see FIG. 3C).

Figure 3D:
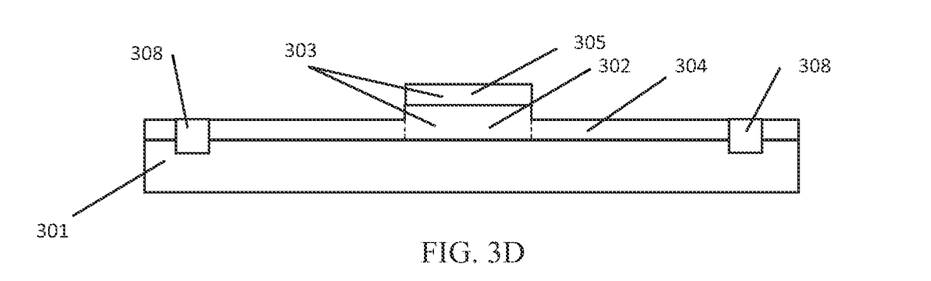

Etching the photoconverter 304 region that is outside the avalanche amplifier 303 region to the depth of 0.5 μm to 2.5 μm, but less than the multiplication layer 302 thickness thereby forming an avalanche amplifier 303 as a mesa structure (see FIG. 3D).

Figure 3E:
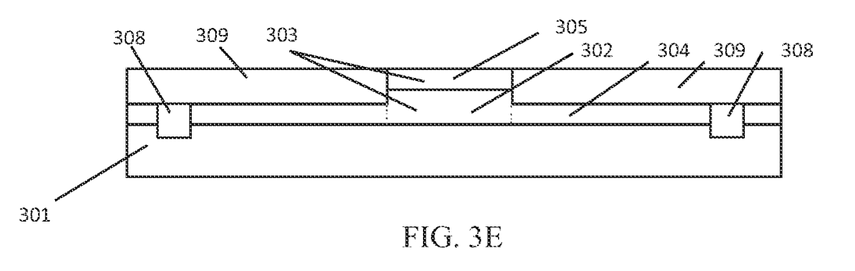

Depositing, onto the etched-away area of the photoconverter 304 region, a dielectric layer, so that it fills the entire area of the photoconverter 304 that has been etched away (see FIG. 3E).

Figure 3F:
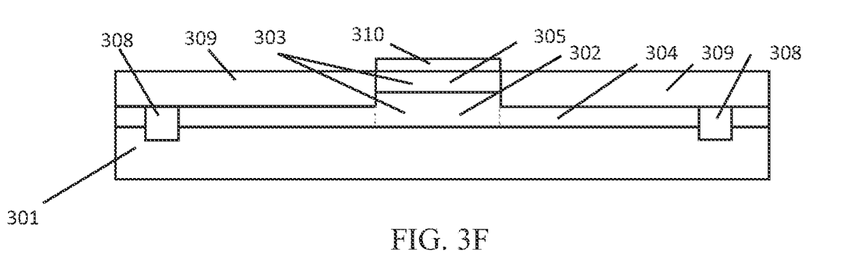

Forming, in the contact layer 305 of the avalanche amplifier 303 region, a high-resistance layer 310 (see FIG. 3F).

Figure 3G:
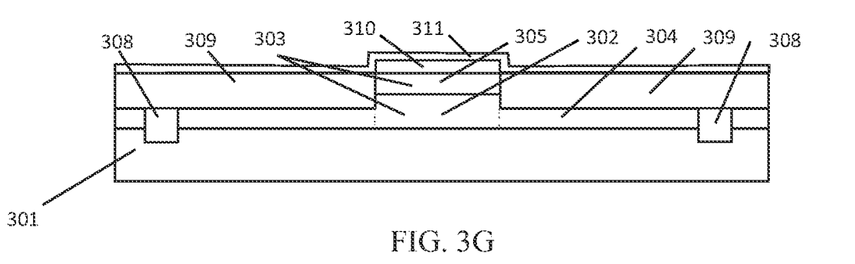

Forming, on top of the high-resistance layer 310 and dielectric layer 309, a transparent electrode 311 (see FIG. 3G).

Figure 3H:
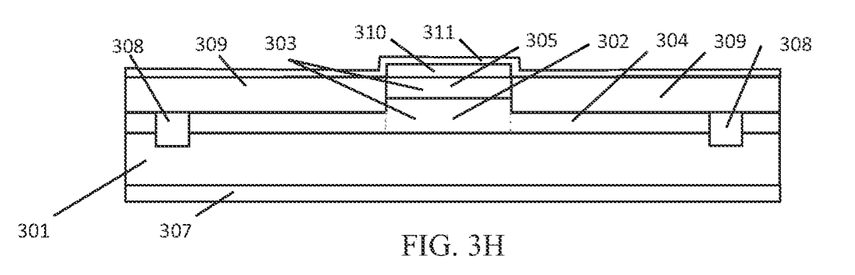
Figure 4A:
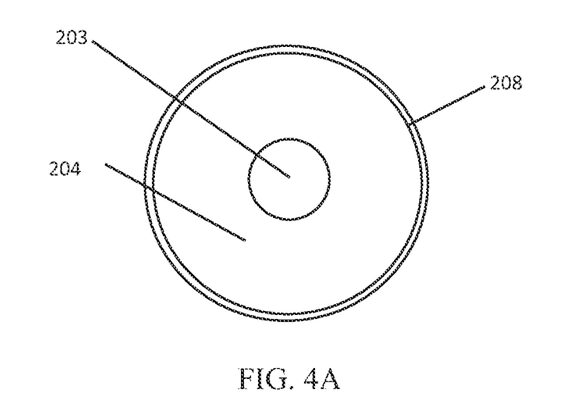
FIGS. 4A and 4B are schematic top views of the APD according to the second embodiment that comprises a single avalanche amplifier or four avalanche amplifiers, respectively.
Figure 4B:
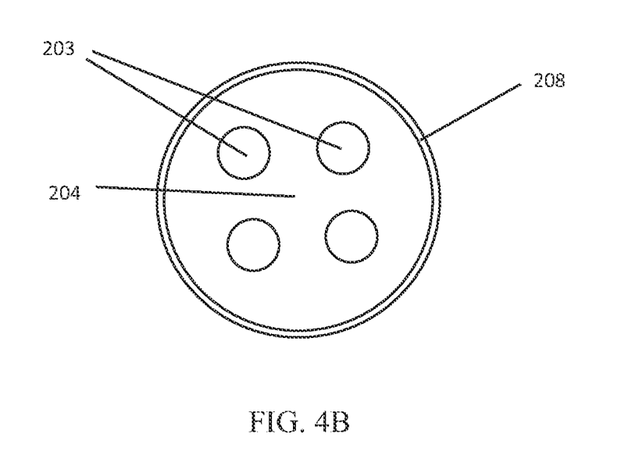

Forming, on top of the semiconductor wafer 301, a second electrode 307 (see FIG. 3H).

An exemplary APD according to FIG. 3 can be manufactured using the method that involves formation, by epitaxy, of the multiplication layer 302, which has width of 5-7 μm and is made of p-type silicon with dopant concentration of $10^{15}$-$10^{17}$ cm$^{-3}$, on the silicon wafer 301 of the p+-type with dopant concentration higher than $10^{18}$ cm$^{-3}$. Then, a closed groove 308 with the width of 1.5 μm to 2.0 μm and the depth, which is more than or equal to the multiplication layer thickness, but less than the total thickness of the wafer and multiplication layer combined, is etched on the multiplication layer 302 surface and filled with highly doped polycrystalline silicon of the same conductivity type as the multiplication layer 302, so that a photodetector can be formed inside the region bounded by said groove.

The avalanche amplifier 303 is made by putting the contact layer 305, formed through diffusion of the n-type dopant with concentration of more than $10^{18}$ cm$^{-3}$ to the depth of 0.5-1.0 μm, onto the multiplication layer 302. The photoconverter layer 304 outside the avalanche amplifier 303 is etched away to the depth that is less than the multiplication layer 302 thickness, and the etched-away area of the photoconverter layer is filled with the dielectric layer 309, so that its outer edge lines up with the outer edge of the contact layer 305. The photoconverter 304 region can be etched away, e.g., by about 1.5-2.5 μm. The high-resistance layer 310 is formed on the surface of the contact layer 305 in the form of a high-resistance polycrystalline silicon film that is about 1 megaohm/μm$^2$ at 100 nm thick, and then the transparent electrode 311, which is an ITO or AZO film that is 100-200 nm thick, is deposited onto the entire outer surface of the high-resistance layer and dielectric layer.

Finally, the second electrode 307, which is an aluminum foil with thickness of 0.5-1.0 μm, is deposited onto the bottom surface of the wafer 301.

In the APD as shown in FIG. 3, positive voltage applied to the transparent electrode 311 relative to the electrode 307, generates an electric field in the multiplication region 302 of the avalanche amplifier with enough intensity to trigger impact ionization in said region causing free charge carriers to multiply. Meanwhile, photoelectrons that appear in the photoconverter 304 region drift towards the multiplication region 302, driven by superposition of electric fields, one of which seeps from the avalanche amplifier and the other forms under the transparent electrode 311 that is put onto the dielectric layer 309, thus enabling efficient transmission of signal photocarriers into the avalanche amplifier and, accordingly, achieving high threshold sensitivity of the instrument.

At the same time, positioning of multiplication regions 302 and photocarrier generation regions 304 on different levels reduces parasite optical communication, i.e., makes it less likely that a photon produced by a hot charge carrier during avalanche multiplication in an amplifier triggers avalanche multiplication in an adjacent one. Excessive noise caused by this effect, which diminishes the threshold sensitivity of an APD with multiple avalanche amplifiers, is additionally reduced by reflecting parasite photons from the borders of the dielectric layer 309 located between avalanche amplifiers.

The high-resistance layer 310, which is located on top of the contact layer 305 of the avalanche amplifier, provides negative feedback when the avalanche is formed, thus allowing one to achieve higher multiplication coefficients, particularly, when operating in the so-called "Geiger" mode.

All the design and technical steps applied to the APD as shown in FIG. 3 in order to improve its threshold sensitivity resulted in, particularly, an instrument with multichannel amplification that has a unique set of working parameters—above all, a threshold sensitivity that is many times as high as that of conventional APDs, especially in the situation of excessive background illumination, which is typical of vehicle LiDARs.

A detailed description of the advantages of the claimed solution is provided in the article co-authored by the inventors: D. A. Shushakov, S. V. Bogdanov, N. A. Kolobov, E. V. Levin, Y. I. Pozdnyakov, T. V. Shpakovskiy, V. E. Shubin, K. Y. Sitarsky, R. A Torgovnikov, "The new-type silicon photomultiplier for ToF LIDAR and other pulse detecting applications," Proc. SPIE 10817, Optoelectronic Imaging and Multimedia Technology V, 108170J (8 Nov. 2018); doi: 10.1117/12.2505120 (researchgate.net/publication/328836757_The_new-type_silicon_photomultiplier_for_ToF_LIDAR_and_other_pulse_detecting_applications).

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A method for manufacturing an avalanche photodetector, the method comprising:
    forming a multiplication layer on an upper surface of a semiconductor wafer;
    forming, on an upper surface of the multiplication layer at least one avalanche amplifier as a mesa structure, by (i) forming a contact layer on a portion of the upper surface of the multiplication layer, while simultaneously forming a photoconverter region as part of the multiplication layer outside the contact layer, and (ii) etching away a portion of the multiplication layer in the photoconverter region to a depth that is less than a thickness of the multiplication layer;
    forming a dielectric layer on a surface of the multiplication layer where the etching took place, such that a thickness of the dielectric layer is equal to a depth of the multiplication layer in the photoconverter region that was previously etched away;
    forming a first electrode of a transparent material on surfaces of both the contact layer and the dielectric layer;
    forming a second electrode on a bottom surface of the semiconductor wafer.

2. The method of claim 1, wherein the multiplication layer is formed using the epitaxy method.

3. The method of claim 1, wherein the contact layer is made by doping the multiplication layer with a dopant that forms a layer with an opposite conductivity.

4. The method of claim 1, further comprising forming a closed groove on a surface of the multiplication layer, so that a depth of the closed groove is greater than or equal to a thickness of the multiplication layer, but less than a total thickness of the semiconductor wafer and the multiplication layer combined, and filling the closed groove with highly-doped polycrystalline silicon of the same conductivity type as the multiplication layer, wherein the closed groove has a width of 1.5 μm to 2.0 μm.

5. The method of claim 1, wherein a high-resistance layer is formed on the contact layer of the avalanche amplifier before the first electrode is formed.

6. A method for manufacturing an avalanche photodetector, the method comprising:
    forming a multiplication layer on an upper surface of a semiconductor wafer;
    etching a closed groove on a surface of the multiplication layer, so that a depth of the closed groove is greater than or equal to a thickness of the multiplication layer, but less than a total thickness of the semiconductor wafer and the multiplication layer combined;
    filling the closed groove with highly-doped polycrystalline silicon of the same conductivity type as the multiplication layer;
    forming, on an upper surface of the multiplication layer inside the closed groove at least one avalanche amplifier as a mesa structure, by (i) forming a contact layer on a portion of the upper surface of the multiplication layer, while simultaneously forming a photoconverter region as part of the multiplication layer outside the contact layer, and (ii) etching away a portion of the multiplication layer in the photoconverter region to a depth that is less than a thickness of the multiplication layer;
    forming a dielectric layer on a surface of the multiplication layer where the etching took place, a thickness of the dielectric layer being equal to the depth of the multiplication layer in the photoconverter region that was etched away previously;
    forming a first electrode of a transparent material on surfaces of both the contact layer and the dielectric layer;
    forming a second electrode on a bottom surface of the semiconductor wafer.

7. The method of claim 6, wherein the semiconductor wafer is made of a low-resistance material.

8. The method of claim 6, wherein both the semiconductor wafer and the multiplication layer are made of the same semiconductor material.

9. The method of claim 6, wherein the multiplication layer is formed using the epitaxy method.

10. The method of claim 6, wherein the contact layer is made by doping the multiplication layer with a dopant that forms a layer with an opposite conductivity.

11. The method of claim 6, wherein the closed groove has a width of 1.5 µm to 2.0 µm.

12. The method of claim 6, wherein the closed groove is circular in plan view.

13. The method of claim 6, wherein the closed groove is hexagonal in plan view.

14. The method of claim 6, wherein the high-resistance layer is formed on the contact layer of the avalanche amplifier before the first electrode is formed.

* * * * *